United States Patent
Huang et al.

[11] Patent Number: 6,046,062
[45] Date of Patent: Apr. 4, 2000

[54] METHOD TO MONITOR THE KINK EFFECT

[75] Inventors: Kuo-Ching Huang, Kaohsiung; Chuan-Jane Chao, Hsin-Chu; Kuei-Ying Lee, Chu-Dong; Yean-Kuen Fang, Ann Nan, all of Taiwan

[73] Assignee: Taiwan Semiconductor Manufacturing Company, Hsin-Chu, Taiwan

[21] Appl. No.: 09/373,246

[22] Filed: Aug. 12, 1999

[51] Int. Cl.[7] .............................. G01R 31/26; H01L 21/66
[52] U.S. Cl. ............................................................... 438/18
[58] Field of Search .................................. 438/18, 14–17; 257/353

[56] References Cited

U.S. PATENT DOCUMENTS

| | | | |
|---|---|---|---|
| 4,053,916 | 10/1977 | Cricchi et al. | 257/353 |
| 5,185,280 | 2/1993 | Houston et al. | 437/44 |
| 5,489,792 | 2/1996 | Hu et al. | 257/347 |

*Primary Examiner*—Charles Bowers
*Assistant Examiner*—Craig Thompson
*Attorney, Agent, or Firm*—George O. Saile; Stephen B. Ackerman

[57] ABSTRACT

This invention relates to the characterization of integrated circuit devices and more particularly to an improved method for monitoring for unacceptable kink behavior, in the threshold voltage characteristics of FET devices, that can be caused by a tendency for reduced gate oxide thickness and reduced substrate doping concentration, along the length of channel regions bounded by STI. This is achieved by comparing a pair of drain current versus gate voltage characteristics, as a function of two values of substrate voltage. Relative voltage shifts between the two curves are compared at a value of drain current that is well below the kink and at a value of drain current that is well above the kink. The quantitative degree of kink behavior is determined by how much greater the voltage shift, corresponding to the value of drain current well above the kink, exceeds the voltage shift, corresponding to the value of drain current well below the kink.

14 Claims, 5 Drawing Sheets

METHOD TO MONITOR THE KINK EFFECT

FIELD OF THE INVENTION

This invention relates to the electrical characterization of integrated circuit devices and more particularly to a method for using I-V threshold voltage curves as a quantitative means of monitoring for the presence of reduced gate oxide thickness and/or reduced substrate doping, along the edges of the channel region of a MOSFET device.

BACKGROUND OF THE INVENTION AND PRIOR ART

As the dimensions of MOSFET devices have been pushed deeper and deeper into the sub-micron regime, increasing demands have been placed on controlling and characterizing the fabrication methods that are used to electrically isolate those devices from one another. The more common methods used for isolating MOSFET devices usually employ narrow strips of oxide layers and underlying doped silicon layers, that are placed in between the closely spaced devices. The purpose of the oxide is to provide electrical isolation while also providing lower lateral device to substrate capacitance, relative to older junction isolation methods. The purpose of the underlying doping layers is to avoid the formation of conducting channels that could, otherwise, result in unwanted buried current paths between adjacent devices. As device dimensions have continued to shrink, the associated isolation structures between the devices have continually been improved, in order to conserve space while also allowing for improved speed performance (lower capacitance).

FIGS. 1a and 1b illustrate cross-sectional and top views, respectively, of an early popular isolation method, based on the Local Oxidation of Silicon, LOCOS, which was first invented in 1970. Referring more particularly to the cross-sectional view of FIG. 1a, there is shown a P type semiconductor substrate 2, an overlying relatively thin gate oxide region 4 and a further overlying polysilicon gate region 6, representing one of a plurality of isolated N channel MOSFET devices. FIGS. 1a and 1b also show the surrounding LOCOS isolation structure, for the MOSFET device, which is comprised of a P doped channel stop region 8 and an overlying relatively thick LOCOS oxide region 10. It is noted that the LOCOS oxide region 10 is usually thermally grown in the presence of a silicon nitride feature (previously removed and not shown), which is used to prevent a thick oxide layer from also being simultaneously grown in gate oxide region 4. As a result, evidence can still be seen of the partial extension of the thick oxide growth, under the previously removed nitride feature, in the form of a |Bird's Beak| 12. It is also noted that the same thermal processing for thick oxide region 10 tends to undesirably make the P type channel stop region 8 encroach into gate region 4. It is further noted that the highly graded Bird's Beak shape 12, along with the encroachment of the channel stop region 8 has historically posed a number of problems for the LOCOS based fabrication of sub-micron devices. Consequently, subsequent improvements in isolation technology have led to more recent advances such as Shallow Trench Isolation, STI, methods.

FIGS. 2a and 2b illustrate cross-sectional and top views, respectively, of a more recent STI method for isolating sub-micron devices. Referring now more particularly to the cross-sectional view of FIG. 2a. there is shown a P type semiconductor substrate 20, an overlying relatively thin gate oxide region 22 and a further overlying polysilicon gate region 24, representing one of a plurality of isolated N channel MOSFET devices. FIGS. 2a and 2b also show the surrounding STI isolation structure, for the MOSFET device, which is comprised of a P doped channel stop region 26 and an overlying relatively thick STI oxide region 28. It is noted that STI oxide region 28 is usually fabricated by first etching a shallow trench into the silicon substrate and then filling the trench with a CVD oxide layer which is subsequently planarized.

From an examination of FIG. 2a, the aforementioned |Bird's Beak| problem of FIG. 1a, has been avoided. Also, the relatively lower thermal cycle needed for the CVD STI oxide tends to, beneficially, reduce the aforementioned channel stop encroachment problem of FIG. 1a. These are some of the reasons why the STI method of FIGS. 2a and 2b has increasingly become a desirable replacement for the LOCOS method of FIGS. 1a and 1b.

Although STI is now widely used in deep sub-micron process technologies, as a LOCOS replacement, it does have its own problems. For example, along the edge of the device channel (part A, illustrated in FIGS. 2a and 2b), there is a tendency for the gate oxide to be thinner at the boundary between the gate oxide and the STI oxide. This |thinning effect| is caused by larger stresses in the corner regions as well as by orientation dependence. Furthermore, along the same edge of the device channel (part A, illustrated in FIGS. 2a and 2b), there is also a tendency for the doping concentration of the substrate to be lower. This is due to the |segregation effect|, where boron tends to thermally segregate from silicon to oxide regions.

Continuing to refer to FIG. 2a and 2b, the above STI problems, associated with the |thinning effect| and doping |segregation effect| will tend to cause the device threshold voltage to be lower in Part A of the device channel, relative to Part B of the device channel. Consequently, as illustrated in FIG. 3, the device will tend to behave as two devices in parallel, where the effective device along the edge of the channel region (part A) has a very different threshold voltage characteristic (defined as a drain current versus gate voltage characteristic) than the more centrally located region of the channel (part B). As shown in FIG. 3, the overall threshold voltage characteristic for the device is a superposition of the threshold voltage characteristics for parts A and B, whereby the resultant overall characteristic exhibits a characteristic hump or |kink| as a indicator of the above problems. This |Kink Effect| can, in turn, lead to very undesirable sub-threshold current problems that can usually be controlled by proper considerations in device design and in process design. However, there can be situations where a relevant process, in this regard, has gone out of control and needs to be corrected as soon as possible. For detecting such process control problems, one might consider monitoring for an unacceptable kink in a threshold voltage characteristic. However, that, in turn, poses the problem of how to detect an unacceptable kink by some means that is less subjective than merely observing a device threshold characteristic, similar to that of FIG. 3. As will now be described, the present invention solves this subjectivity problem by providing an innovative quantitative electrical characterization method that is inherently sensitive to any oxide thickness or doping differences between parts A and B of FIGS. 2a and 2b.

SUMMARY OF THE INVENTION

A principle object of the present invention is to provide an effective characterization method for detecting unacceptable threshold voltage characteristics that are related to gate oxide thickness and substrate doping concentration differences between the edges and the more central regions of MOSFET device channel regions, over a semiconductor substrate.

Another object of the present invention is to provide a characterization method for detecting unacceptable kinks, in the threshold voltage characteristics of MOSFET devices, that are related to gate oxide thickness and substrate doping concentration differences along the edges as opposed to the more central regions of MOSFET device channel regions.

A further object of the invention is to provide a method for detecting unacceptable kinks in the threshold voltage characteristics related to gate oxide thickness and substrate doping problems, along the edges of MOSFET devices bounded by STI, that is highly compatible with the manufacturing needs of state of the art MOS and CMOS technologies.

A still further and primary object of the present invention is to provide a quantitative method, for detecting such unacceptable kinks in threshold voltage characteristics, that is inherently sensitive to changes, of interest, in gate oxide thickness and substrate doping along the channel edges of deep sub-micron devices bounded by StI.

These objects are achieved by an I-V curve comparison method comprising the steps of: (a) generating a first threshold voltage characteristic, corresponding to a source to substrate voltage of zero volts; (b) generating a second threshold voltage characteristic, corresponding to a specified source to substrate voltage greater than zero volts; (c) determining a first difference in the gate voltages, $\Delta V1$. from the first and second threshold voltage characteristics, corresponding to a relatively low specified drain current, Id1, lying well below the kink; (d) determining a second difference in gate voltages, $\Delta V2$. from the first and second threshold voltage characteristics, corresponding to a relatively high specified drain current Id2, lying well above the kink; and (e) examining the degree to which $\Delta V2$ exceeds $\Delta V1$, as a quantitative monitor of the extent to which a device is suffering from the above |kink effect| problem.

BRIEF DESCRIPTION OF THE DRAWINGS

In the accompanying drawings for a material part of this description, there is shown.

DESCRIPTION OF THE PREFERRED EMBODIMENTS

Figure 4:
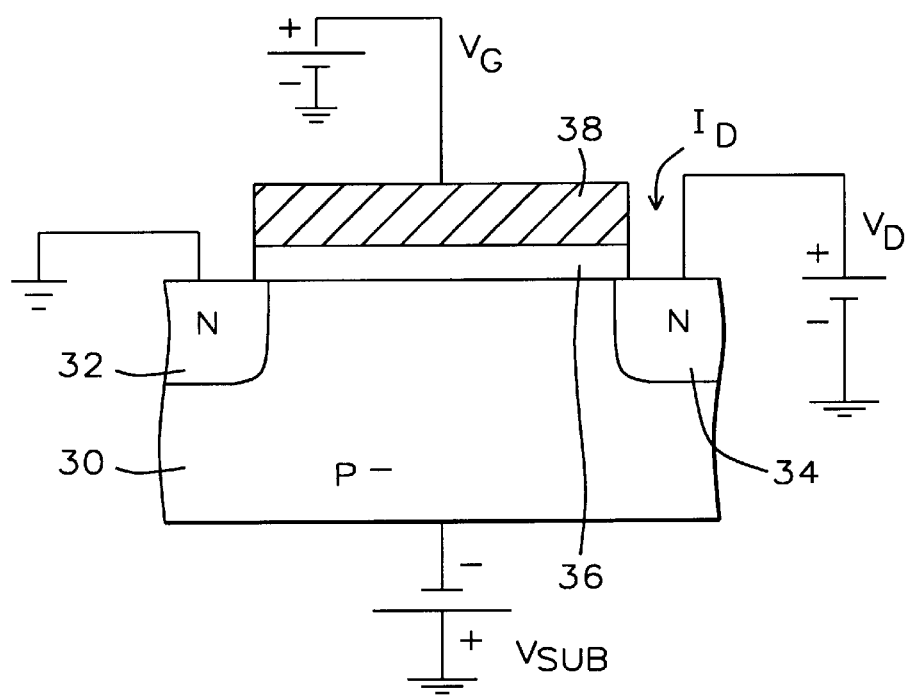
FIG. 4 shows the simplified electrical MOSFET biasing configuration that is used for discussing the theory of the present invention.

It is noted that the following preferred embodiments and associated figures are intended to be presented in a way that can be generally applied to the fabrication of N channel and/or P channel devices that could be used in either a CMOS or an NMOS technology, for example, where the ability to monitor the aforementioned Kink effect is desired. However, for the purposes of discussion, the following preferred embodiments will be presented in terms of an N channel device. Referring now more particularly to FIG. 4, there is shown a simplified cross-sectional representation of an N channel MOSFET device. There is shown a semiconductor substrate 30 intended to represent a conventional ion implanted N well or P well region, in which said simplified FET device has been formed. Said simplified FET device is comprised of an N doped source 32 and N doped drain 34 an overlying gate oxide 36 and a further overlying polysilicon gate electrode 38. Continuing to refer to FIG. 4 there is also shown an electrical biasing configuration, comprising: (a) a ground connection to said source region 32; (b) a gate voltage, Vg, applied to said polysilicon gate region 38; (c) a drain voltage, Vd, applied to said drain region 34; (d) a corresponding drain current, Id, and (e) a substrate voltage, Vsub, applied to said substrate 30.

The theory for the present invention is based on how the Id vs Vg threshold voltage characteristic for said biased device, of FIG. 4, behaves as a function of Vsub. It will be shown that said Id vs Vg characteristic is inherently sensitive to variations of interest in the thickness of said gate oxide 36 as well as to variations in the doping concentration of said substrate 30. The same said theory will then be interpreted in terms of the two effective parallel MOSFET devices, that were previously discussed, for the device of FIGS. 2a and 2b, in order to explain said Kink-Effect problem of FIG. 3. The same said theory will then be further extended for the case of two values of said substrate voltage, Vsub, in order to describe said threshold voltage characteristic comparison method, upon which the present invention is based.

Referring, again, to said biased MOSFET device, of FIG. 4, said Id vs Vg threshold voltage characteristic will now be described in terms of the threshold voltage, Vt, of said device, which is defined as the value of Vg corresponding to strong inversion of the surface of said substrate 30. From semiconductor device theory, it can be shown that said Vt value can be determined by the following relationship (Eq. #1):

$$Vt = Vfb + 2\psi b + \gamma(2\psi b + Vsub)^{1/2} \quad (1)$$

Where:

Vfb=flatband voltage of the device of FIG. 4.

$2\psi b$=band bending of said substrate 30, corresponding to strong inversion, where: $\psi b = (KT/q)Ln(Na/ni)$ where: K=Boltzman's Constant=8.62E-5 eV/K T=absolute temperature.

q=unit electron charge=1.602E-19 coul.

Na=doping concentration of said Substrate 30, at/cm$^3$.

ni=intrinsic carrier concentration corresponding to ambient temperature=1E10 carriers/cm$^3$.

$\gamma$=Body Effect=$(2qNa\epsilon o\epsilon si)^{1/2}Tox/(\epsilon o\epsilon ox)$ where: $\epsilon o$=permittivity of free space=8.86E-14 farads/cm $\epsilon si$=relative permittivity of Si≈11.8

$\epsilon ox$=relative permittivity of said gate oxide≈3.9

Tox=thickness of said gate oxide, cm.

The above theory, Eq. 1, is described in S. Wolf, Silicon Processing for the VLSI Era, Vol. 3, pp. 144–147 (Lattice Press 1995), which is incorporated herein by reference.

Referring now more particularly to Eq. 1, it can be observed that the value of said threshold voltage, Vt, will increase as the value of said substrate voltage. Vsub, is increased. Furthermore, from Eq.1, the value of said threshold voltage is expected to reduce as the value of said substrate doping, Na, is reduced or as the value of said gate oxide thickness, Tox, is reduced. These sensitivities of Vt to Vsub, Na and Tox are the key to the present invention, as will now be discussed.

Figure 1A:
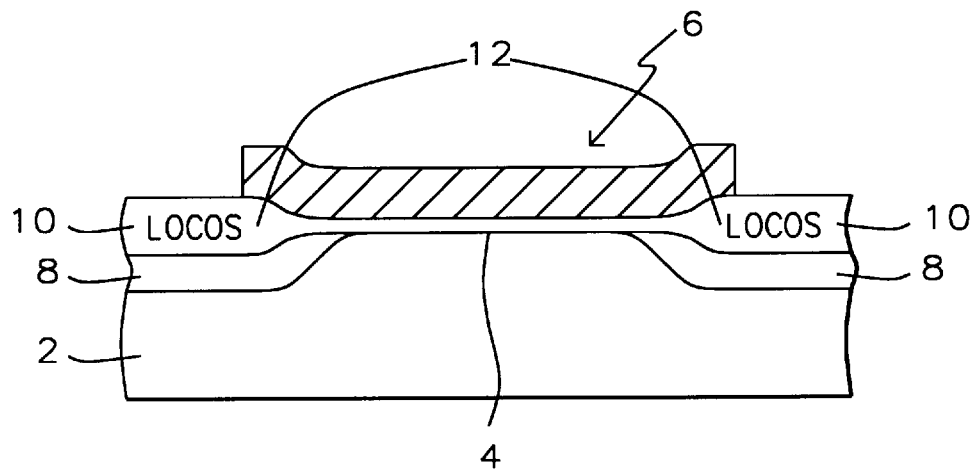
FIGS. 1a, 1b, 2a and 2b schematically show, in cross-sectional and top-view illustrations, the device isolation structures that are used for the background discussions for the present invention.
Figure 1B:
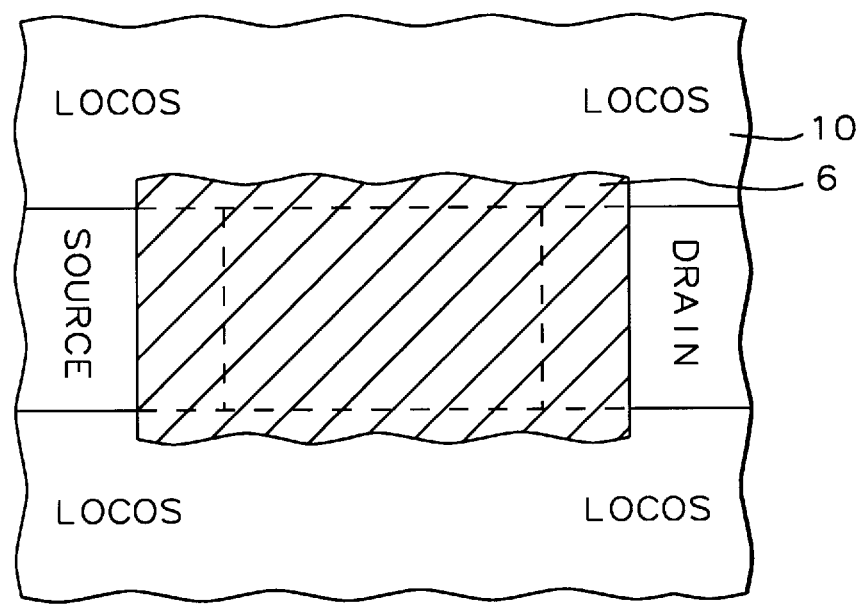
Figure 2A:
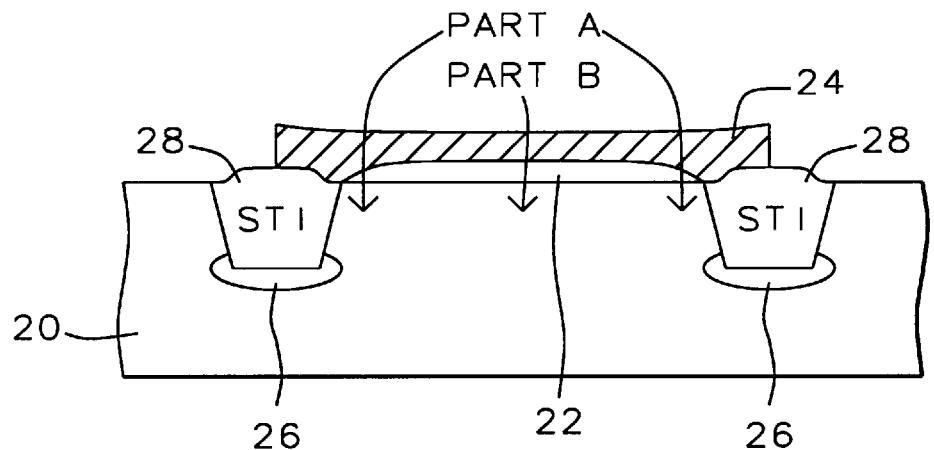
Figure 2B:
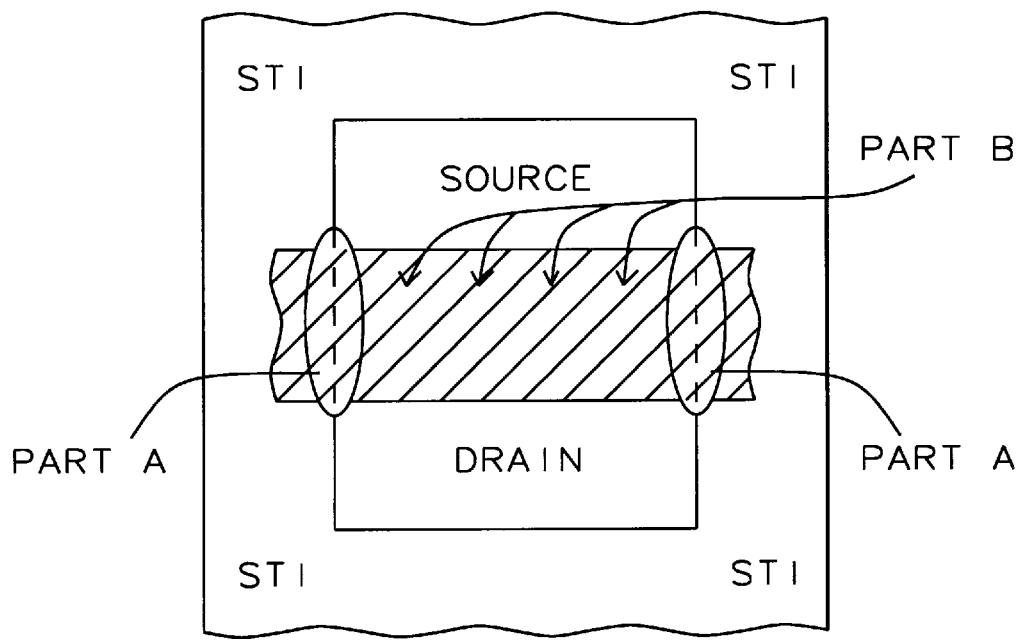

Continuing to refer to Eq. 1, and applying it to said STI based device, of FIGS. 2a and 2b, the expected Id vs Vg threshold voltage characteristic for said STI based device can be approximated. This will now be done by superimposing the expected Id vs Vg characteristic for said part A, of FIGS. 2a and 2b, along with the expected Id vs Vg characteristic for said part B. of FIGS. 2a and 2b.

Figure 3:
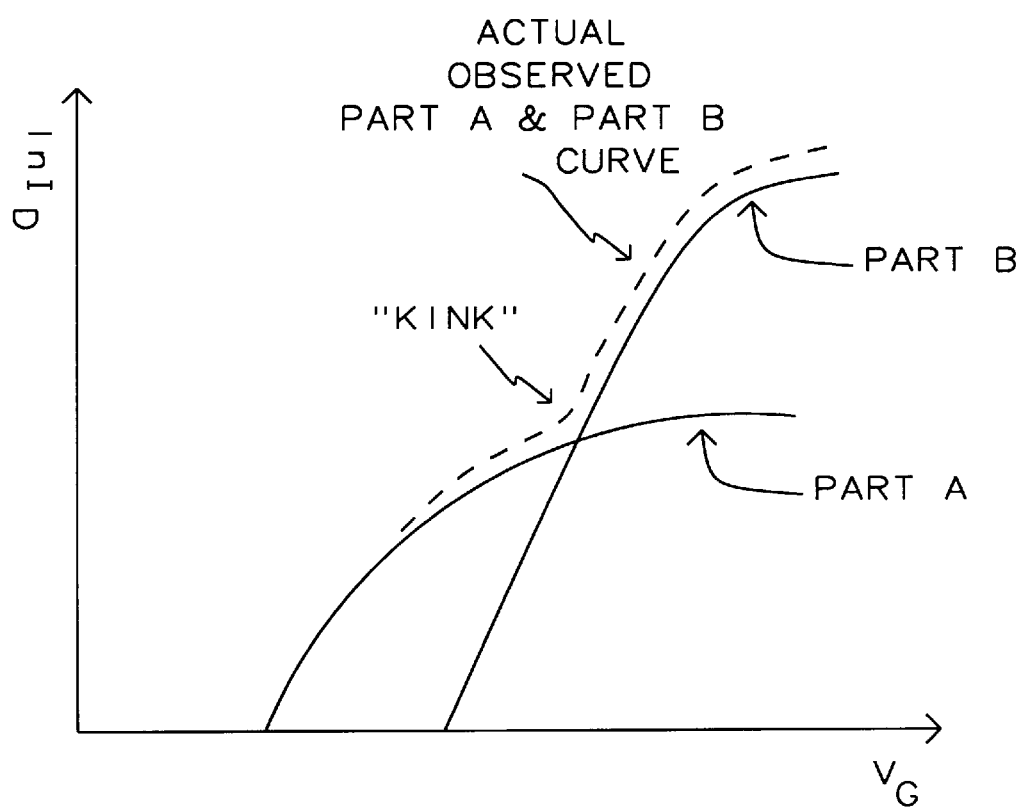
FIG. 3 illustrates the threshold voltage characteristics that are associated with the "kink effect" monitoring problem that is solved by the present invention.

Referring now more particularly to FIG. 3, there is shown said expected Id vs Vg characteristics for said channel parts A and B. of FIGS. 2a and 2b, for the case of said Vsub=0 volts. As previously discussed, said part A lies along the edge of the channel region, bounded by STI, where the values of said gate oxide and substrate doping are relatively lower than that of said Part B. Therefore, as also illustrated in FIG. 3, Eq. 1 predicts that a conducting channel will first form along said part A region, relative to said part B region, as a function of increasing Vg. Furthermore, the channel along part A, of the device of FIGS. 2a and 2b, will be relatively narrow (only along the edge of the channel region), in contrast to a relatively wider channel width for part B. Therefore, as also illustrated in FIG. 3, the saturating value of Id for part A will be substantially less than that for part B.

Lastly, the approximate shape of the actual Id vs Vg characteristic that one would observe for the case of the device of FIGS. 2a and 2b can now be constructed by simply adding (superimposing) the parallel, channel current paths, corresponding to said parts A and B. along the Vg axis, as is further illustrated in FIG. 3. Said actual observed part A plus part B characteristic, of FIG. 3, illustrates said Kink-Effect problem that would tend to be exhibited by said STI based device of FIGS. 2a and 2b. As previously noted, the key to the present invention is based on the relative gate oxide thickness and substrate doping dependent shifting of said part A and part B contributions, along the Vg axis, as a function of Vsub. Said relative shifting can be more readily discussed by considering said Body Effect term, γ, of Eq. 1 as a multiplier of the general tendency for Vt to increase with increasing values of Vsub. Accordingly, when the magnitude of Vsub is increased in the typical direction of reverse biasing the source/substrate junction of FIG. 4, the degree of the general increase in Vt will be relatively less for channel regions that have relatively lower values of gate oxide thickness and substrate doping. Therefore, as Vsub is increased, the corresponding Vt shift for said part A contribution to FIG. 3 will tend to be less than that for said part B contribution, as illustrated in FIG. 5.

Figure 5:
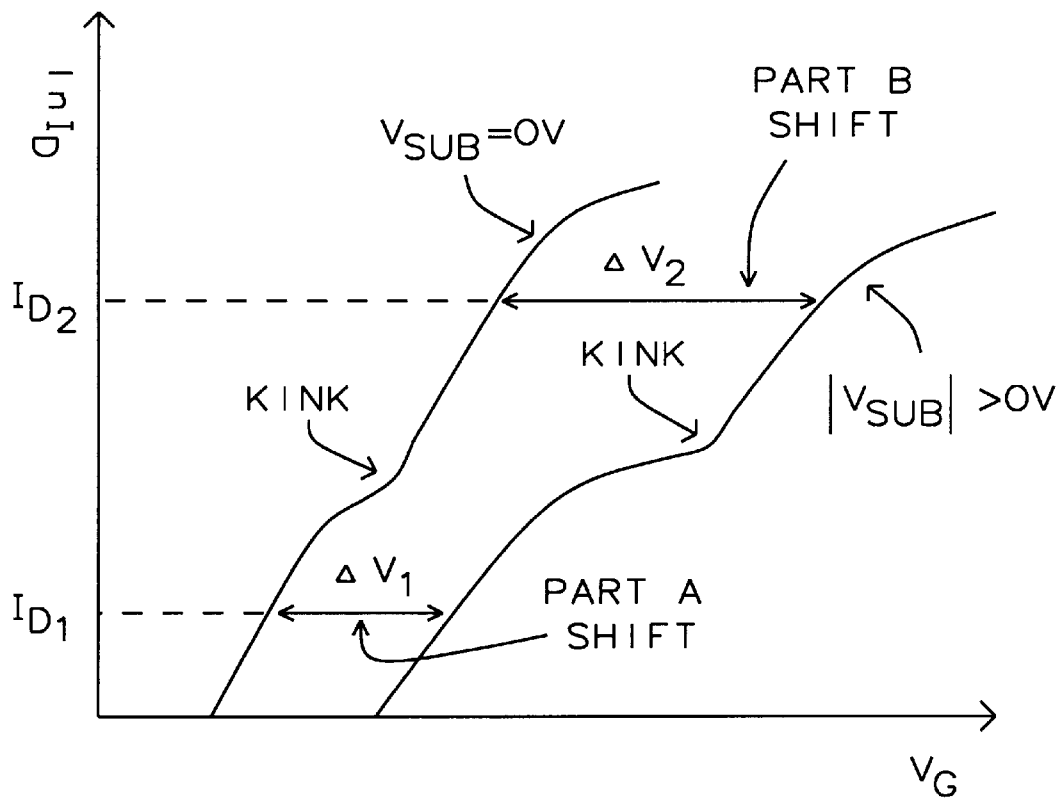
FIG. 5 illustrates the comparison of two voltage-current characteristics, which is discussed as the key element of the present invention.

Referring now more particularly to FIG. 5, there is shown a hypothetical actual Id vs Vg characteristic, similar to that of FIG. 3, for the case of said Vsub=0 volts. Also shown is a hypothetical shifted Id vs Vg characteristic, for the case of Vsub>0 volts. Similar to the previously discussed Id vs Vg curves, of FIG. 3, said curves of FIG. 5, are intended to represent the superposition of the expected Id vs Vg behavior of said channel parts A and B. of said STI device, of FIGS. 2a and 2b. Continuing to refer to FIG. 5, the steps for the characterization method of the present invention can now described as follows: (a) generate a first Id vs Vg characteristic, corresponding to Vsub=0 volts; (b) generate a second Id vs Vg characteristic corresponding to some specified Vsub>0 volts; (c) determine the shift in gate voltages, ΔV1, from said first and second Id vs Vg characteristics, for a specified drain current, Id1, corresponding to said part A contributions of said Id vs Vg characteristics; (d) determine the shift in gate voltages, ΔV2, from said first and second Id vs Vg characteristics, for a specified drain current, Id2, corresponding to said part B contributions of said Id vs Vg characteristics; and (e) examine the ratio ΔV2 to ΔV1, as a quantitative monitor of the extent to which a device is suffering from the above |kink effect| problem.

The objects of the invention have now been accomplished. A quantitative characterization method has been provided for assessing the degree of said undesirable kink effect in the Id vs Vg characteristics of deep sub-micron MOSFET devices that is usually associated with a tendency for gate oxide thinning and substrate doping segregation along the edges of channel regions bounded by STI. While the invention has been particularly shown and described with reference to the preferred embodiments thereof, it will be understood by those skilled in the art that various changes in form and details may be made without departing from the spirit and scope of the invention.

What is claimed is:

1. A method for characterizing a kink effect in the drain current vs gate voltage characteristic of an FET device, comprising the steps of:
    (a) generating a first threshold voltage characteristic, corresponding to a source to substrate voltage of zero volts;
    (b) generating a second threshold voltage characteristic, corresponding to a specified source to substrate voltage of a magnitude greater than zero volts;
    (c) determining a first difference in gate voltages, ΔV1, from said first and second threshold characteristics, corresponding to a relatively low first specified drain current, lying well below the kink;
    (d) determining a second difference in gate voltages, ΔV2, from said first and second threshold characteristics, corresponding to a relatively high specified drain current, lying well above the kink; and
    (e) examining the degree to which said ΔV2 exceeds said ΔV1, as a quantitative monitor of the extent to which a device is suffering from the above kink effect problem that has been aggravated by said changes in substrate voltage.

2. The method of claim 1 wherein said FET device exhibits a transverse gradient in gate oxide thickness, such that the oxide is relatively thinner along the edge of the channel length region.

3. The method of claim 1 wherein said FET device exhibits a transverse gradient in substrate doping, such that the substrate doping is relatively lower along the length of the channel region.

4. The method of claim 1 wherein the range of changes in said substrate voltage is between about 0 and −5 volts.

5. A method for characterizing a kink effect in the drain current vs gate voltage characteristic of a deep sub-micron FET device, whose channel region is bounded by STI, comprising the steps of:
    (a) generating a first threshold voltage characteristic, corresponding to a source to substrate voltage of zero volts;
    (b) generating a second threshold voltage characteristic, corresponding to a specified source to substrate voltage of a magnitude greater than zero volts;
    (c) determining a first difference in gate voltages, ΔV1, from said first and second threshold characteristics, corresponding to a relatively low drain current, which lies well below said kink;

(d) determining a second difference in gate voltages, $\Delta V2$, from said first and second threshold characteristics, corresponding to a relatively high drain current, which lies well above said kink; and (f) examining the ratio of said $\Delta V2$ to said $\Delta V1$, as a quantitative monitor of the extent to which a device is suffering from said kink effect, due to a tendency for gate oxide thickness and substrate doping to be reduced, along the length of said STI bounded channel region.

6. The method of claim 5 wherein the range of gate voltage for generating said FET device characteristics is between about 0 and 5 volts.

7. The method of claim 5 wherein the range of drain voltage used for generating said FET device characteristics is between about 0 and 5 volts.

8. The method of claim 5 wherein the range of drain current used for generating said FET device characteristics is between about 1 na/cm and $10E^3$ na/cm.

9. The method of claim 5 wherein the range of substrate voltage used for generating said FET device characteristics is between about 0 and −5 volts.

10. The method of claim 5 wherein the algorithm for selecting said relatively high drain current, well above said kink, is:

to choose a value of $V_{gs}$ greater than $V_t$.

11. The method of claim 5, wherein the range of gate oxide thickness for said characterized FET device is in the range of between about 15 and 120 angstroms.

12. The method of claim 5, wherein the range of substrate doping for said characterized FET device is in the range of between about $10_{16}$ and $10_{16}$ at/cm$_3$.

13. The method of claim 5, wherein the range of channel width for said characterized FET device is in a range of between about 0.15 and 1.0 microns.

14. The method of claim 5, wherein the range of channel lengths for characterized FET device is in a range of between about 0.15 and 1.0 microns.

* * * * *